United States Patent
Peng et al.

(10) Patent No.: US 9,905,793 B1
(45) Date of Patent: Feb. 27, 2018

(54) ORGANIC LIGHT-EMITTING DEVICE AND METHOD OF MANUFACTURING THE SAME, AND DISPLAY DEVICE

(71) Applicant: BOE TECHNOLOGY GROUP CO., LTD., Beijing (CN)

(72) Inventors: Rui Peng, Beijing (CN); Xinwei Gao, Beijing (CN); Leilei Cheng, Beijing (CN); Wenbin Jia, Beijing (CN); Xinxin Wang, Beijing (CN); Daqing Hu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/527,045

(22) PCT Filed: Nov. 15, 2016

(86) PCT No.: PCT/CN2016/105950
§ 371 (c)(1),
(2) Date: May 16, 2017

(87) PCT Pub. No.: WO2017/118219
PCT Pub. Date: Jul. 13, 2017

(30) Foreign Application Priority Data

Jan. 6, 2016 (CN) .......................... 2016 1 0009483

(51) Int. Cl.
*H01L 51/52* (2006.01)
*H01L 51/54* (2006.01)
*H01L 51/56* (2006.01)

(52) U.S. Cl.
CPC .......... *H01L 51/5203* (2013.01); *H01L 51/56* (2013.01)

(58) Field of Classification Search
CPC ............................ H01L 51/5203; H01L 51/56
See application file for complete search history.

(56) References Cited

U.S. PATENT DOCUMENTS 9,166,196 B2 * 10/2015 Yamana .............. H01L 51/0096
2006/0292362 A1 12/2006 Hsu et al.
(Continued)

FOREIGN PATENT DOCUMENTS

CN 101616799 A 12/2009
CN 102255052 A 11/2011
(Continued)

OTHER PUBLICATIONS

International Search Report of PCT/CN2016/105950 in Chinese, dated Feb. 6, 2017 with English translation.
(Continued)

*Primary Examiner* — Donald Raleigh
(74) *Attorney, Agent, or Firm* — Collard & Roe, P.C.

(57) ABSTRACT

Disclosed are an organic light-emitting device and a method of manufacturing the same, and a display device. The organic light-emitting device includes: a first electrode layer, a second electrode layer, and an organic light-emitting layer sandwiched between the first electrode layer and the second electrode layer, wherein the first electrode layer includes a first transparent conductive layer, a nanostructured layer and a second transparent conductive layer sequentially, and the second transparent conductive layer is closer to the organic light-emitting layer than the first transparent conductive layer. In the organic light-emitting device, silver nanowires or carbon nanotubes can be introduced between the two transparent conductive layers of the first electrode layer, which facilitates the injection equilibrium of electrons-holes, thereby improving the quantum efficiency. Therefore, the organic light-emitting device has a high luminous efficiency.

18 Claims, 1 Drawing Sheet

(56) References Cited

U.S. PATENT DOCUMENTS

| | | |
|---|---|---|
| 2009/0208733 A1 | 8/2009 | Lee et al. |
| 2011/0156577 A1* | 6/2011 | Koyama .................. H01B 1/22 |
| | | 313/504 |
| 2014/0014915 A1* | 1/2014 | Koo .................... H01L 51/5203 |
| | | 257/40 |
| 2016/0211316 A1* | 7/2016 | Oh ...................... H01L 27/3279 |
| 2016/0233450 A1 | 8/2016 | Yang et al. |
| 2016/0285029 A1* | 9/2016 | Jeon .................... H01L 51/5203 |
| 2017/0214002 A1* | 7/2017 | Riedel ................. H01L 51/5271 |

FOREIGN PATENT DOCUMENTS

| | | |
|---|---|---|
| CN | 102629669 A | 8/2012 |
| CN | 103444262 A | 12/2013 |
| CN | 104201290 A | 12/2014 |
| CN | 104362260 A | 2/2015 |
| CN | 104576968 A | 4/2015 |
| CN | 105449120 A | 3/2016 |
| CN | 205264761 A | 5/2016 |
| KR | 10-2015-0134725 A | 12/2015 |

OTHER PUBLICATIONS

Notice of Transmittal of the International Search Report of PCT/CN2016/105950 in Chinese, dated Feb. 6, 2017.

Written Opinion of the International Searching Authority of PCT/CN2016/105950 in Chinese, dated Feb. 6, 2017 with English translation.

First Chinese Office Action in Chinese Application No. 201610009483.0, dated Dec. 9, 2016 with English translation.

Second Chinese Office Action in Chinese Application No. 201610009483.0, dated Jun. 5, 2017 with English translation.

Koo, W. H. et al. "Light extraction from organic light-emitting diodes enhanced by spontaneously formed buckles." Nature Photonics, vol. 4, Apr. 2010, published online Feb. 21, 2010, 5 pages.

* cited by examiner

ORGANIC LIGHT-EMITTING DEVICE AND METHOD OF MANUFACTURING THE SAME, AND DISPLAY DEVICE

CROSS REFERENCE TO RELATED APPLICATIONS

This application is the National Stage of PCT/CN2016/105950 filed on Nov. 15, 2016, which claims priority under 35 U.S.C. § 119 of Chinese Application No. 201610009483.0 filed on Jan. 6, 2016, the disclosure of which is incorporated by reference.

TECHNICAL FIELD

Embodiments of the present disclosure relate to an organic light-emitting device and a method of manufacturing the same, and a display device.

BACKGROUND

Since the birth of Organic Light-Emitting Diode (OLED), it has been widely used in the display and lighting industry owing to its advantages such as self-luminescence, light weight, high color gamut and low energy consumption. However, the development of OLED is currently limited by many conditions. For example, ITO (indium tin oxide) is currently used as a transparent anode, the bottom emitting traditional organic light-emitting diode can achieve an external quantum efficiency up to only 30%, i.e., the luminous efficiency is low.

SUMMARY

Embodiments of the present invention provide an organic light-emitting device and a method of manufacturing the same, and a display device, which can achieve a high luminous efficiency.

In a first aspect, embodiments of the present invention provide an organic light-emitting device, comprising a first electrode layer, a second electrode layer, and an organic light-emitting layer sandwiched between the first electrode layer and the second electrode layer, wherein the first electrode layer comprises a first transparent conductive layer, a nanostructured layer and a second transparent conductive layer sequentially, and the second transparent conductive layer is closer to the organic light-emitting layer than the first transparent conductive layer.

Optionally, a material for forming the nanostructured layer comprises silver nanowires or carbon nanotubes.

Optionally, the nanostructured layer has a periodically undulating microstructure at an interface with the second transparent conductive layer.

Optionally, the first transparent conductive layer is formed on a substrate; the nanostructured layer is formed on the first transparent conductive layer; and the second transparent conductive layer, the organic light-emitting layer and the second electrode layer are sequentially formed on the nanostructured layer in an equal thickness manner.

Optionally, the periodically undulating microstructure is a wavy structure.

Optionally, the microstructure is formed by rolling a rod-like roller in a predetermined direction on the nanostructured layer before being cured.

Optionally, the second transparent conductive layer has a thickness less than that of the first transparent conductive layer.

In a second aspect, an embodiment of the present invention further provides a method of manufacturing an organic light emitting device, comprising:

forming a first transparent conductive layer on the substrate;

forming a nanostructured layer on the first transparent conductive layer;

forming a second transparent conductive layer on the nanostructured layer;

preparing an organic light-emitting layer on the second transparent conductive layer; and forming a second electrode layer on the organic light-emitting layer.

Optionally, the material for forming the nanostructured layer comprises silver nanowires or carbon nanotubes.

Optionally, the forming a nanostructured layer on the first transparent conductive layer comprises:

coating the first transparent conductive layer with a suspension solution of silver nanowires or a dispersion of carbon nanotubes;

rolling on the coated first transparent conductive layer in a predetermined direction using a rod-like roller to form a nanostructured layer having a periodically undulating microstructure at the surface; and curing the nanostructured layer.

Optionally, the nanostructured layer is formed in a nitrogen atmosphere and/or under vacuum.

Optionally, if the material for forming the nanostructured layer comprises silver nanowires, the method may further comprise:

increasing the adhesion between the nanostructured layer and the first transparent conductive layer in a photon sintering manner after forming the nanostructured layer on the first transparent conductive layer.

In a third aspect, embodiments of the present invention provide a display device, comprising any one of the organic light-emitting devices described above.

As can be seen from the above technical solutions, in the organic light-emitting device according to the embodiments of the present invention, the design of introducing silver nanowires or carbon nanotubes between the two transparent conductive layers of the first electrode layer facilitates injection equilibrium of electrons-holes, thereby improving the quantum efficiency. Therefore, the organic light-emitting devices according to embodiments of the present invention can have a high luminous efficiency.

BRIEF DESCRIPTION OF THE DRAWINGS

In order to more clearly illustrate the technical solutions of the embodiments of the present invention, the drawings of the embodiments are briefly described below. Apparently, the drawings described below relate to only some embodiments of the present invention and thus are not limitative on the present invention.

DETAILED DESCRIPTION

Figure 1:
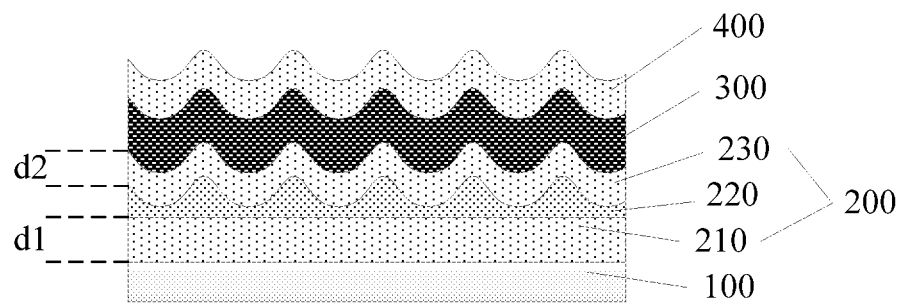
FIG. 1 is a structural schematic view of an organic light-emitting device according to an embodiment of the present invention.

To make clearer the objects, technical solutions and advantages of the embodiments of the present invention, a clear and full description of the technical solutions of the embodiments of the present invention will be made with reference to the accompanying drawings. Apparently, the embodiments described are just part rather than all of the embodiments of the present invention. Based on the embodiments of the present invention as described, all the other embodiments obtained by a person of ordinary skill in the art, without any creative labor, fall within the protection scope of the present invention.

In a first aspect, embodiments of the present invention provide an organic light-emitting device, comprising a first electrode layer, a second electrode layer, and an organic light-emitting layer sandwiched between the first electrode layer and the second electrode layer, wherein the first electrode layer comprises a first transparent conductive layer, a nanostructured layer and a second transparent conductive layer sequentially, and the second transparent conductive layer is closer to the organic light-emitting layer than the first transparent conductive layer.

It should be noted that the organic light emitting device of the embodiment of the present invention can be provided with reference to a structure of an organic light emitting diode (OLED) in the prior art, and the present invention is not limited thereto. Specifically, indium tin oxide (ITO) may be used to form the first transparent conductive layer and the second transparent conductive layer, and the second electrode layer may be formed of a metal or a conductive resin. It is to be understood that the first electrode layer and the second electrode layer respectively form two electrodes of the organic light emitting device and supply a driving voltage or driving current to the organic light emitting layer for emitting light.

In the organic light emitting device provided by the embodiment of the present invention, a nanostructure layer is introduced between two transparent conductive layers of one of the electrode layers, and such a design contributes to injection equilibrium of electrons-holes, thereby improving the quantum efficiency. Due to the high quantum efficiency, the organic light emitting device provided by the embodiment of the present invention can have a high luminous efficiency.

In a second aspect, embodiments of the present invention provide a method of manufacturing an organic light-emitting device, which can be used for making the organic light-emitting device as described in the first aspect and comprises:

forming a first transparent conductive layer on a substrate;

forming a nanostructured layer on the first transparent conductive layer;

forming a second transparent conductive layer on the nanostructured layer;

preparing an organic light-emitting layer on the second transparent conductive layer; and forming a second electrode layer on the organic light-emitting layer.

Upon specific implementation, there may be a variety of specific structures of the above-mentioned organic light-emitting devices, and the corresponding preparation methods are also different. The following will be illustrated with reference to the accompanying drawings.

Reference may be made to FIG. 1 for a particular structure of an organic light-emitting device according to the embodiment of the present invention, which comprises:

a substrate 100, a first electrode layer 200 formed on the substrate 100 (the first electrode layer 200 specifically including a first transparent conductive layer 210, a nanostructured layer 220, and a second transparent conductive layer 230), an organic light-emitting layer 300 further formed on the second transparent conductive layer 230, and a second electrode layer 400 further formed on the organic light-emitting layer 300; wherein the material of the nanostructured layer 220 may include silver nanowires or carbon nanotubes; both the upper surface of the nanostructured layer 220 and the lower surface of the second transparent conductive layer 230 have a wavy microstructure (i.e., there is a wavy microstructure at their interface); both the second transparent conductive layer 230 and the organic light-emitting layer 300 have a layer structure of a uniform thickness so that the upper surface of the second transparent conductive layer 230 and the upper surface of the organic light-emitting layer 300 have a shape consistent with the upper surface of the nanostructured layer 220, i.e., they both have a wavy microstructure. Furthermore, the second transparent conductive layer 230 has a thickness d2 that is less than the thickness d1 of the first transparent conductive layer 210.

In the embodiment of the present invention, the design of introducing a nanostructured layer 220 between the two transparent conductive layers 210 and 230 of the first electrode layer 200 facilitates injection equilibrium of electrons-holes, thereby improving the quantum efficiency. As a consequence, the organic light-emitting device according to the embodiment of the present invention can have a high luminous efficiency.

Meanwhile, in the embodiment of the present invention, the nanostructured layer 220 has a wavy microstructure at the interface with the second transparent conductive layer 230. Moreover, because the second transparent conductive layer 230 and the organic light-emitting layer 300 are both layer structures with a uniform thickness, the shapes of the upper surfaces of the second transparent conductive layer 230 and the organic light-emitting layer 300 are consistent with that of the upper surface of the nanostructured layer 220, i.e., both of them also have a wavy microstructure. Such a design can reduce the waveguide effect and the microcavity effect, thereby improving the light out-coupling efficiency of the organic light-emitting device and further improving the luminous efficiency of the organic light-emitting device. It is to be understood that, upon specific implementation, the waveguide effect and the microcavity effect can be reduced to a certain degree if the upper surface (i.e., the interface with the layer structure thereabove) of any one or two of the nanostructured layer 220, the second transparent conductive layer 230 and the organic light-emitting layer 300 has a microstructure, and such technical solutions should also fall within the protection scope of the present invention. Further, even if the upper surfaces of the nanostructured layer 220, the second transparent conductive layer 230, and the organic light-emitting layer 300 are flat, the corresponding technical solutions can still improve the luminous efficiency as compared with the prior art, and should fall within the protection scope of the present invention. It is to be understood that although the embodiments of the present invention are illustrated with a periodically undulating microstructure which is a wavy microstructure, the periodically undulating microstructure in actual applications may also be in other forms as long as it is periodically undulating. The corresponding technical solutions should achieve similar effects and thus should also fall within the protection scope of the present invention.

Besides, in the embodiment of the present invention, a first transparent conductive layer 210 is formed on a substrate 100, and then a nanostructured layer 220, a second transparent conductive layer 230, an organic light-emitting layer 300, and a second electrode layer 400 are sequentially formed on the transparent conductive layer 210. Such a design results in convenience for fabrication. Apparently, other structural designs may also be used in practical applications, for example, a second electrode layer 400 is formed on a substrate 100 followed by forming an organic light-emitting layer 300, a second transparent conductive layer 230, a nanostructured layer 220, and a first transparent conductive layer 210 sequentially on the second electrode layer 400. Such a technical solution can also improve the quantum efficiency. The structure in FIG. 1 is not to be construed as limiting the protection scope of the present invention.

Upon specific implementation, the microstructure described above may be formed by rolling a rod-like roll in a predetermined direction onto the nanostructured layer prior to curing. On the one hand, the production is less difficult; on the other hand, the nanostructured layer made has a micro-structure that is evenly distributed, thereby improving the quantum efficiency. Apparently, the microstructures described above may also be microstructures made in other ways in particular embodiments.

In the embodiments of the present invention, the thickness of the second transparent conductive layer is set smaller than the thickness of the first transparent conductive layer, which can further improve the light out-coupling efficiency of the organic light-emitting device. In particular embodiments, the first transparent conductive layer herein may have a thickness of from about 100 to about 200 nm and the second transparent conductive layer may have a thickness of from about 50 to about 100 nm.

In particular embodiments, the materials of the first transparent conductive layer and the second transparent conductive layer herein may be transparent electrode materials such as ITO and the like. The nanostructured layer may be formed of silver nanowires or carbon nanotubes.

In particular embodiments, the above-mentioned manufacturing method may specifically include the following steps if it is used for producing the organic light-emitting device described above:

Step 1: a transparent electrode material is deposited on a substrate to form a first transparent conductive layer.

Figure 2:
FIGS. 2 to 4 show a flow chart of a method of manufacturing an organic light-emitting device according to an embodiment of the present invention.

In particular embodiments, an ITO material layer of about 100 to 200 nm can be formed on the substrate by a magnetron sputtering process as the first transparent conductive layer. Reference may be made to FIG. 2 for the structure obtained after step S1, which includes a substrate 100 and a first transparent conductive layer 210 formed on the substrate 100.

Step S2: a nanostructured layer is formed on the first transparent conductive layer, wherein the material for forming the nanostructured layer comprises silver nanowires or carbon nanotubes.

In particular embodiments, a suspension solution (which may be a about 0.5% isopropanol suspension) of silver nanowires or a dispersion (about 0.1-0.5 wt % dispersion in an ethanol solution) of carbon nanotubes may be scraped onto the surface of the first transparent conductive layer 210, which is then rolled with a rod-like roll in one direction. The rolling pressure may be 0.1-0.3 MPa, which can result in a number of periodically undulating microstructures.

In particular embodiments, in order to make the surface of the nanostructure layer robust, a curing step may be performed after forming silver nanowires. Specifically, the curing step may include a film-forming solidification process and a hardening process. The film-forming solidification process can be placing the substrate on which silver nanowires have been formed in a vacuum oven for solidification wherein the vacuum for solidification can be about 100-133 Pa, and the temperature can be room temperature to about 60° C.; the hardening process can be baking the solidified structure at about 100° C. to about 200° C. for about 30 min.

In particular embodiments, these processes may be carried out in a nitrogen atmosphere or under vacuum, and different operations can be carried out in a nitrogen atmosphere and under vacuum to prevent the silver nanowires from being oxidized in the air.

Figure 3:
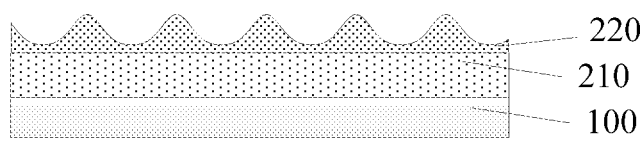

Reference may be made to FIG. 3 for the structure obtained after step S2, which further includes a nanostructure layer 220 having a microstructure on the upper surface as compared to FIG. 2.

In step S3, the adhesion between the nanostructure layer and the first transparent conductive layer is increased by photon sintering.

In particular embodiments, the exposure time for photonic sintering can be controlled as from about 500 to 2000 μs.

Step S3 can enhance the adhesion between the nanostructured layer and the first transparent conductive layer. Of course, in particular embodiments, step S3 is not a necessary step. In particular, if the material for forming the nanostructure layer is a carbon nanotube dispersion, it is not necessary to perform step S3 here.

In step S4, a transparent electrode material is deposited on the nanostructured layer to form a second transparent conductive layer.

In particular embodiments, an ITO material layer of about 50-100 nm may be deposited on the nanostructure layer as the second transparent conductive layer. During the deposition process, the thickness of the resulting second transparent conductive layer at each position can be made equal by reasonable controlling. This enables the upper surface of the second transparent conductive layer to also have a microstructure.

Figure 4:
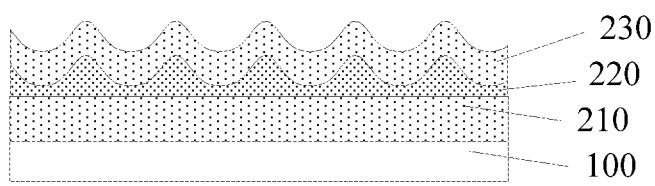

Reference may be made to FIG. 4 for the structure obtained after step S4, which further includes a second transparent conductive layer 230 as compared to FIG. 3.

In step S5, an organic light-emitting layer and a second electrode layer are formed sequentially on the second transparent conductive layer.

Reference may be made to FIG. 1 for the structure obtained after step S5, which further comprises an organic light-emitting layer 300 and a second electrode layer 400 as compared to FIG. 4.

In a third aspect, embodiments of the present invention further provide a display device, comprising any organic light-emitting device as described in the first aspect. It shall be noted that the display device may be any product or component having a display function, such as a display panel, electronic paper, a mobile phone, a tablet, a TV set, a monitor, a laptop, a digital photo frame, a navigator, or the like.

Unless otherwise defined, the technical terms or scientific terms used herein shall have general meanings interpreted by a person of ordinary skill in the art to which the present invention pertains. The words "first", "second" and the like used in the description and claims of the present application do not denote any order, quantity or importance, but are merely used to distinguish different components. Likewise, the words "one", "a", "an" and the like do not denote any limitation on number, but represent the presence of at least one. The words "comprise", "include" and the like mean that the elements or objects preceding the words cover the elements or objects listed after the words and their equivalents, without excluding other elements or objects. The words "upper", "lower", "left", "right" and the like are used only to represent the relative positional relationship, and the relative positional relationship may be changed accordingly if the absolute position of the object described changes.

It shall be noted that the technical features in the embodiments can be used in any combination if they are not contradictory.

The above are merely exemplary embodiments of the present invention, and are not intended to limit the protection scope of the present invention, which is yet determined by the appended claims.

The present application claims the priority of the Chinese patent application No. 201610009483.0 submitted on Jan. 6, 2016, which is incorporated herein by reference as part of the present application.

The invention claimed is:

1. An organic light-emitting device, comprising a first electrode layer, a second electrode layer, and an organic light-emitting layer sandwiched between the first electrode layer and the second electrode layer, wherein the first electrode layer comprises a first transparent conductive layer, a nanostructured layer and a second transparent conductive layer sequentially, and the second transparent conductive layer is closer to the organic light-emitting layer than the first transparent conductive layer.

2. The organic light-emitting device according to claim 1, wherein a material for forming the nanostructured layer comprises silver nanowires or carbon nanotubes.

3. The organic light-emitting device according to claim 1, wherein the nanostructured layer has a periodically undulating microstructure at an interface with the second transparent conductive layer.

4. The organic light-emitting device according to claim 3, wherein the first transparent conductive layer is formed on a substrate; the nanostructured layer is formed on the first transparent conductive layer; and the second transparent conductive layer, the organic light-emitting layer and the second electrode layer are sequentially formed on the nanostructured layer in an equal thickness manner.

5. The organic light-emitting device according to claim 3, wherein the periodically undulating microstructure is a wavy structure.

6. The organic light-emitting device according to claim 3, wherein the microstructure is formed by rolling a rod-like roller in a predetermined direction on the nanostructured layer before being cured.

7. The organic light-emitting device according to claim 1, wherein the second transparent conductive layer has a thickness less than that of the first transparent conductive layer.

8. A display device, comprising the organic light-emitting device according to claim 1.

9. The organic light-emitting device according to claim 2, wherein the second transparent conductive layer has a thickness less than that of the first transparent conductive layer.

10. The organic light-emitting device according to claim 3, wherein the second transparent conductive layer has a thickness less than that of the first transparent conductive layer.

11. The organic light-emitting device according to claim 4, wherein the second transparent conductive layer has a thickness less than that of the first transparent conductive layer.

12. The organic light-emitting device according to claim 5, wherein the second transparent conductive layer has a thickness less than that of the first transparent conductive layer.

13. The organic light-emitting device according to claim 6, wherein the second transparent conductive layer has a thickness less than that of the first transparent conductive layer.

14. A method of manufacturing an organic light-emitting device, comprising:
   forming a first transparent conductive layer on a substrate;
   forming a nanostructured layer on the first transparent conductive layer;
   forming a second transparent conductive layer on the nanostructured layer;
   preparing an organic light-emitting layer on the second transparent conductive layer; and
   forming a second electrode layer on the organic light-emitting layer.

15. The method according to claim 14, wherein a material for forming the nanostructured layer comprises silver nanowires or carbon nanotubes.

16. The method according to claim 15, wherein the forming a nanostructured layer on the first transparent conductive layer comprises:
   coating the first transparent conductive layer with a suspension solution of silver nanowires or a dispersion of carbon nanotubes;
   rolling on the coated first transparent conductive layer in a predetermined direction using a rod-like roller to form a nanostructured layer having a periodically undulating microstructure at the surface; and
   curing the nanostructured layer.

17. The method according to claim 16, wherein the nanostructured layer is formed in a nitrogen atmosphere and/or under vacuum.

18. The method according to claim 17, wherein if the material for forming the nanostructured layer comprises silver nanowires, the method further comprises:
   increasing the adhesion between the nanostructured layer and the first transparent conductive layer in a photon sintering manner after forming the nanostructured layer on the first transparent conductive layer.

* * * * *